(12) United States Patent
Chung et al.

(10) Patent No.: US 11,342,276 B2
(45) Date of Patent: May 24, 2022

(54) SEMICONDUCTOR DEVICE AND METHOD OF MANUFACTURING SEMICONDUCTOR DEVICE

(71) Applicant: Amkor Technology Korea, Inc., Gwangju (KR)

(72) Inventors: Ji Young Chung, Gyeonggi-do (KR); Jae Ho Lee, Incheon (KR); Byong Il Heo, Gwangju (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/422,771

(22) Filed: May 24, 2019

(65) Prior Publication Data
US 2020/0373247 A1    Nov. 26, 2020

(51) Int. Cl.
*H01L 23/552* (2006.01)
*H01L 23/538* (2006.01)
(Continued)

(52) U.S. Cl.
CPC ........ *H01L 23/552* (2013.01); *H01L 21/4853* (2013.01); *H01L 21/56* (2013.01);
(Continued)

(58) Field of Classification Search
CPC ....... H01L 23/552; H01L 21/56; H01L 25/50; H01L 23/3128; H01L 25/0655; H01L 21/4853; H01L 24/16; H01L 23/5386; H01L 2224/1622; H01L 2021/603; H01L 23/481; H01L 23/49816; H01L 23/5384;
(Continued)

(56) References Cited

U.S. PATENT DOCUMENTS 4,514,750 A * 4/1985 Adams .................. H01L 23/057
174/529
5,043,534 A   8/1991 Mahulikar
(Continued)

FOREIGN PATENT DOCUMENTS

JP    02000294979 A    10/2000
JP    02011049243       3/2011

*Primary Examiner* — Marcos D. Pizarro
(74) *Attorney, Agent, or Firm* — Kevin B. Jackson

(57) ABSTRACT

In one example, an electronic device structure includes a substrate having a conductive structure adjacent to a surface. The conductive structure can include a plurality of conductive pads. First and second electronic devices are disposed adjacent to the top surface. The first electronic device is interposed between a first conductive pad and a second conductive pad, and the second electronic device is interposed between the second conductive pad and a third conductive pad. A continuous wire structure including a first bond structure is connected to the first conductive pad, a second bond structure is connected to the second conductive pad, a third bond structure is connected to the third conductive pad, a first wire portion is interconnected between the first bond structure and the second bond structure and disposed to overlie the first electronic device, and a second wire portion is interconnected between the second bond structure and the third bond structure and disposed to overlie the second electronic device. Other examples and related methods are also disclosed herein.

15 Claims, 9 Drawing Sheets

(51) Int. Cl.
  *H01L 23/31* (2006.01)
  *H01L 23/00* (2006.01)
  *H01L 25/00* (2006.01)
  *H01L 21/48* (2006.01)
  *H01L 21/56* (2006.01)
  *H01L 25/065* (2006.01)
  *H01L 23/498* (2006.01)

(52) U.S. Cl.
  CPC .... *H01L 23/3128* (2013.01); *H01L 23/49816* (2013.01); *H01L 23/5384* (2013.01); *H01L 23/5386* (2013.01); *H01L 24/16* (2013.01); *H01L 25/0655* (2013.01); *H01L 25/50* (2013.01); *H01L 24/49* (2013.01); *H01L 24/85* (2013.01); *H01L 2224/16227* (2013.01); *H01L 2224/4912* (2013.01); *H01L 2224/49096* (2013.01); *H01L 2224/49097* (2013.01); *H01L 2224/49422* (2013.01); *H01L 2224/49427* (2013.01); *H01L 2224/49429* (2013.01); *H01L 2224/97* (2013.01); *H01L 2924/15311* (2013.01); *H01L 2924/15313* (2013.01); *H01L 2924/19107* (2013.01)

(58) Field of Classification Search
  CPC ..... H01L 24/49; H01L 24/85; H01L 2224/97; H01L 2224/4912; H01L 2224/49096; H01L 2224/49422; H01L 2224/49427; H01L 2224/49429; H01L 2924/15311; H01L 2924/15313; H01L 2924/19107
  USPC .......................... 257/700, 773, 777; 174/260
  See application file for complete search history.

(56) References Cited

U.S. PATENT DOCUMENTS

| | | |
|---|---|---|
| 5,557,142 A | 9/1996 | Gilmore |
| 5,614,694 A | 3/1997 | Gorenz, Jr. |
| 6,380,634 B1 | 4/2002 | Umehara |
| 6,538,336 B1 | 3/2003 | Secker |
| 6,686,649 B1 | 2/2004 | Mathews |
| 6,853,055 B1 | 2/2005 | Kuang |
| 7,030,469 B2 | 4/2006 | Mahedevan |
| 8,012,868 B1 | 9/2011 | Santo Naval |
| 8,269,320 B2 | 9/2012 | Huang |
| 8,362,598 B2 | 1/2013 | Park |
| 8,558,365 B1 | 10/2013 | Roa |
| 8,729,682 B1 | 5/2014 | Davis |
| 9,153,543 B1 | 10/2015 | Mangrum |
| 9,240,372 B1 | 1/2016 | Liou |
| 9,362,209 B1 | 6/2016 | Mangrum |
| 2005/0030661 A1 | 12/2005 | Zhao |
| 2007/0030661 A1 | 2/2007 | Morris |
| 2007/0257348 A1 | 11/2007 | Yang |
| 2008/0014678 A1 | 1/2008 | Howard |
| 2008/0310114 A1 | 12/2008 | Pawlenko |
| 2012/0218729 A1 | 8/2012 | Cary |
| 2012/0320558 A1* | 12/2012 | Foster ................. H05K 1/0218 361/818 |
| 2020/0075501 A1* | 3/2020 | Raorane ................. H01L 24/49 |

* cited by examiner

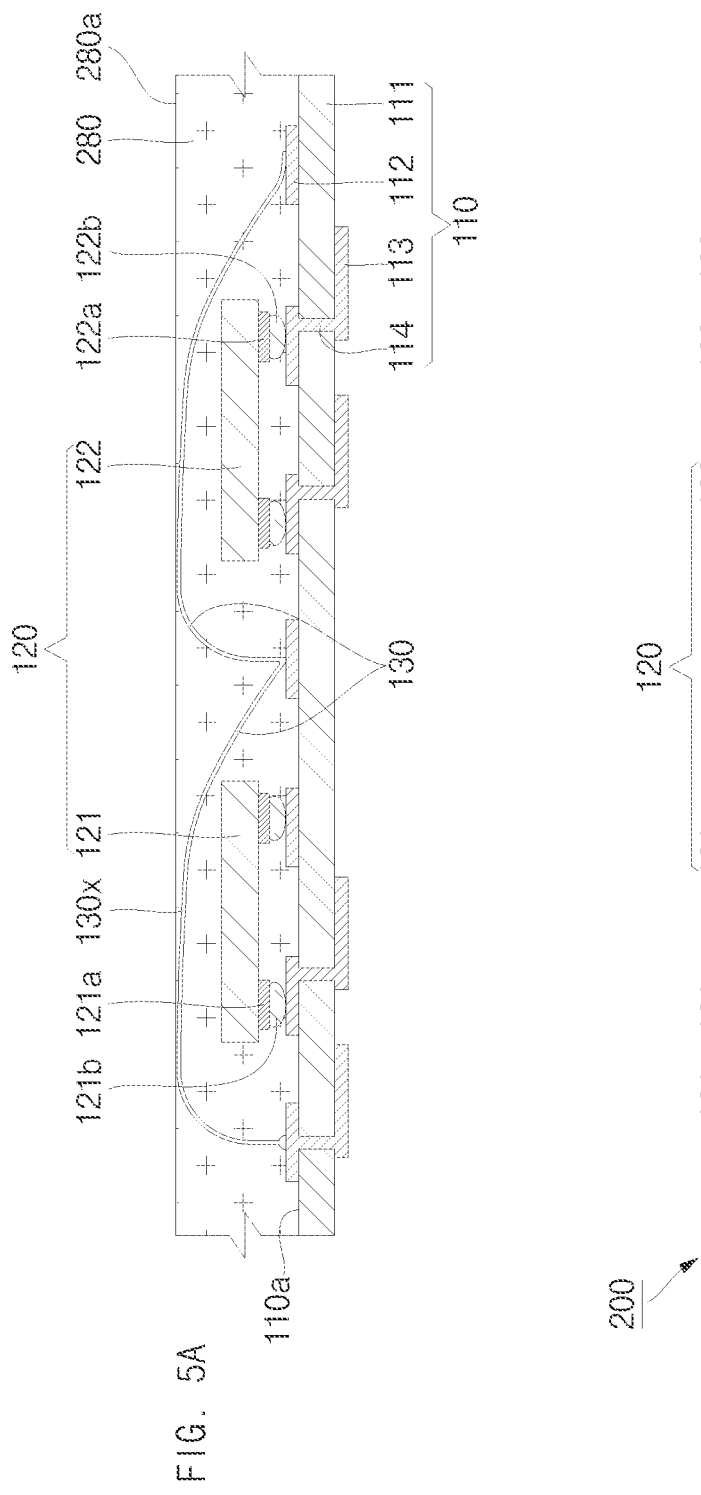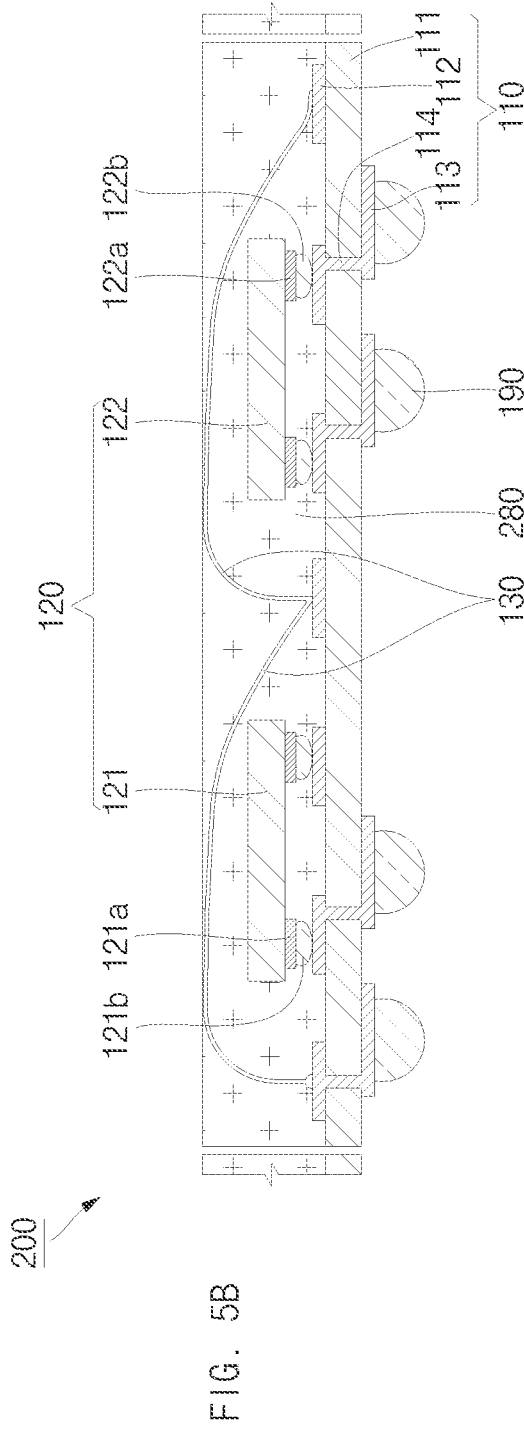
FIG. 5A
FIG. 5B

SEMICONDUCTOR DEVICE AND METHOD OF MANUFACTURING SEMICONDUCTOR DEVICE

CROSS-REFERENCE TO RELATED APPLICATIONS

Not applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 5A and 5B show cross-sectional views of an example method for manufacturing another example semiconductor device.

Figure 1:
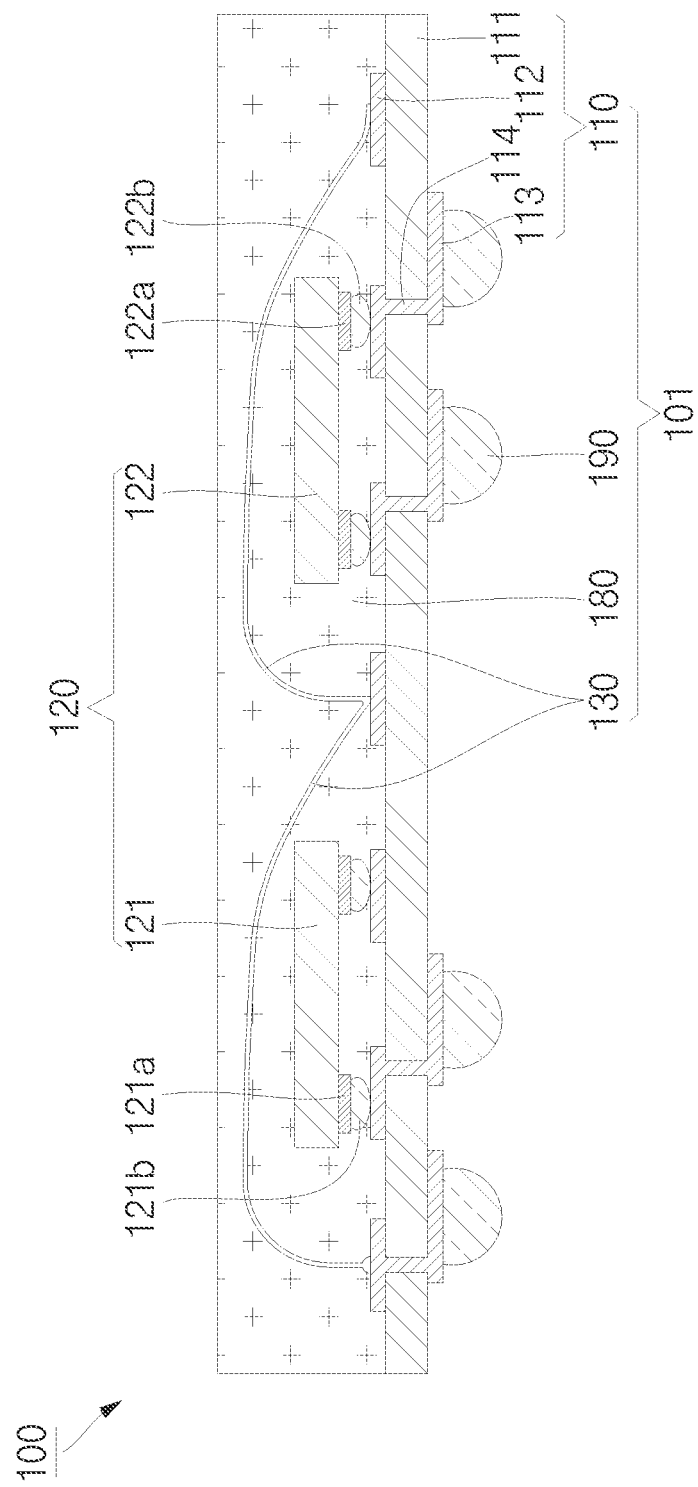
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The terms "and/or" include any single item, or any combination of the items, in the list joined by "and/or". As used in this disclosure, the singular forms are intended to include the plural forms as well, unless the context clearly indicates otherwise.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements. It is further understood that the examples illustrated and described hereinafter suitably may have examples and/or may be practiced in the absence of any element that is not specifically disclosed herein.

DETAILED DESCRIPTION OF THE DRAWINGS

The present description includes, among other features, a packaged electronic device structure and associated methods that comprise one or more wire structures attached to a substrate. In some examples, the wire structure comprises a continuous single wire structure overlying a pair of electronic devices, which can be connected to the substrate. In some examples, the wire structure is connected to a first conductive pad with the a first bond structure, extends to overlie the first electronic device, is connected to a second conductive pad with a second bond structure, extends to overlie the second electronic device, and is connected to a third conductive pad with a third bond structure. In some examples, the second bond structure comprises a stitch bond structure or a compression bond structure, which facilitates the first electronic device be placed closer to the second electronic device. In some examples, the wire structure is configured a cage or shielding structure to reduce the effects of, for example, electromagnetic interference to or from the packaged electronic device. Among other things, the configuration of the wire structure reduces substrate size requirements and saves on manufacturing costs.

More particularly, in one example, an electronic device structure comprises a substrate having a conductive structure. Electronic devices are coupled to the substrate. A first wire structure is connected to the conductive structure in at least three locations. The first wire structure overlies at least two electronic devices and comprises a continuous single wire structure. In some examples, one or more of the electronic devices comprises a semiconductor device. In other examples, at least one of the electronic devices is flip-chip attached to the substrate.

In another example, an electronic device structure comprises a substrate having a top surface, a bottom surface opposite to the top surface, and a conductive structure formed adjacent to the top surface. A first electronic device is disposed adjacent to the top surface at a first location, and a second electronic device is disposed adjacent to the top surface at a second location laterally spaced apart from the first electronic device. A first wire structure comprises a first bond structure connected to the first portion of the conductive structure, a second bond structure connected to a second portion of the conductive structure, a third bond structure connected to a third portion of the conductive structure, a first wire portion interconnected between the first bond structure and the second bond structure and disposed to overlie the first electronic device, and a second wire portion interconnected between the second bond structure and the third bond structure and disposed to overlie the second electronic device. The first wire structure comprises a continuous single wire structure. In some examples, an encapsulant can be disposed to cover the top surface of the substrate, the first electronic device, the second electronic device, and at least a portion of the first wire structure.

In further example, an electronic device structure comprises a substrate having a top surface, a bottom surface opposite to the top surface, and a conductive structure formed adjacent to the top surface. The conductive structure comprises a first conductive pad, a second conductive pad, and a third conductive pad. A first electronic device is disposed adjacent to the top surface at a first location, and a second electronic device is disposed adjacent to the top surface at a second location laterally spaced apart from the first electronic device. In some examples, the first electronic device is interposed between the first conductive pad and the second conductive pad, and the second electronic device is interposed between the second conductive pad and the third conductive pad. A first wire structure comprises a first bond structure connected to the first conductive pad, a second bond structure connected to the second conductive pad, a third bond structure connected to the third conductive pad, a first wire portion interconnected between the first bond structure and the second bond structure and disposed to overlie the first electronic device, and a second wire portion interconnected between the second bond structure and the third bond structure and disposed to overlie the second electronic device, wherein the first wire structure comprises a continuous single wire structure. In some examples, the second bond structure comprises a different bond structure than one or more of the first bond structure or the third bond structure.

In a still further example, a method of forming an electronic device structure comprises providing a substrate having a top surface, a bottom surface opposite to the top surface, and a conductive structure formed adjacent to the top surface, wherein the conductive structure comprises a first conductive pad, a second conductive pad, and a third conductive pad. The method includes providing a first electronic device adjacent to the top surface at a first location, and a second electronic device adjacent to the top surface at a second location laterally spaced apart from the first electronic device. In some examples, the first electronic device is interposed between the first conductive pad and the second conductive pad, and the second electronic device is interposed between the second conductive pad and the third conductive pad. The method includes providing first wire structure comprising a first bond structure connected to the first conductive pad, a second bond structure connected to the second conductive pad, a third bond structure connected to the third conductive pad, a first wire portion interconnected between the first bond structure and the second bond structure and disposed to overlie the first electronic device, and a second wire portion interconnected between the second bond structure and the third bond structure and disposed to overlie the second electronic device, wherein first wire structure comprises a continuous single wire structure. In other examples, the second bond structure comprises a different bond structure than one or more of the first bond structure or the third bond structure.

Other examples are included in the present disclosure. Such examples may be found in the figures, in the claims, and/or in the description of the present disclosure.

FIG. 1 illustrates a cross-sectional view of an example a packaged electronic device structure or an electronic device structure, such as a semiconductor device or semiconductor device structure 100. In the example shown in FIG. 1, semiconductor device 100 can comprise substrate 110, electronic device 120, wire structure 130, encapsulant 180 and interconnects 190.

Substrate 110 can comprise dielectric structure 111 having one or more dielectric layers, and a conductive structure having one or more conductive layers 112, 113 and 114. Electronic device 120 can comprise a plurality of electronic devices, for example, at least two electronic devices 121 and 122. In addition, electronic devices 121 and 122 can comprise terminals 121a and 122a and interconnects 121b and 122b electrically connected to terminals 121a and 122a, respectively. Wire structure 130 can comprise a wire. Wire structure 130 can individually bound a plurality of electronic devices. Encapsulant 180 can cover substrate 110, electronic device 120 and wire structure 130. Interconnects 190 can be positioned on a surface of substrate 110.

Substrate 110, wire structure 130, encapsulant 180 and interconnects 190 can be referred to as semiconductor package 101 or package 101. Semiconductor package 101 can protect the plurality of electronic devices 120 from being exposed to external elements and/or environmental exposure. In addition, semiconductor package 101 can provide an electrical connection between an external components and electronic device 120.

Figure 2A:
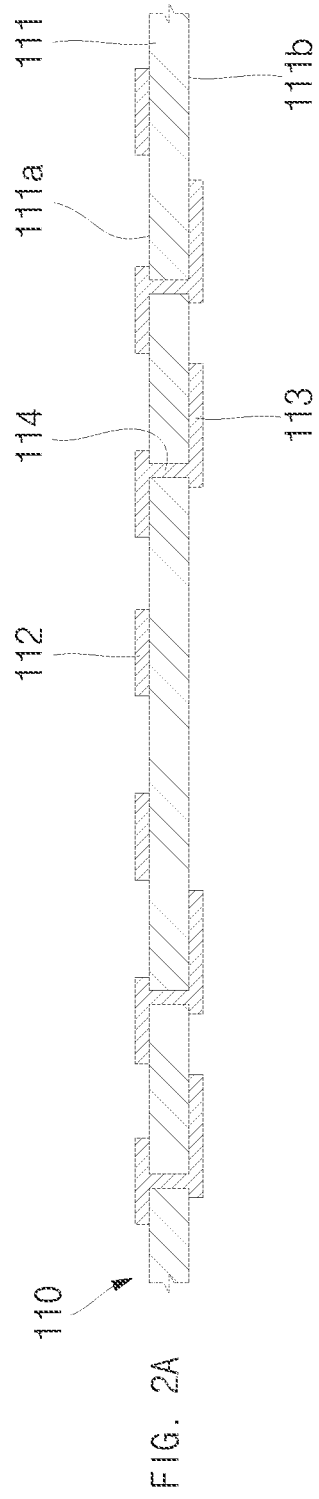
FIGS. 2A, 2B, 2C, 2D, 2E, and 2F show cross-sectional views of an example method for manufacturing an example semiconductor device.

FIGS. 2A to 2F show cross-sectional views of an example method for manufacturing an example semiconductor device 100. FIG. 2A illustrates the semiconductor device 100 at an initial stage of manufacture.

In the example shown in FIG. 2A, substrate 110 can be substantially planar. In addition, substrate 110 can comprise dielectric structure 111 and conductive structure having conductive layer 112 formed at top surface 111a of dielectric structure 111, conductive layer 113 formed at bottom surface 111b of dielectric structure 111, and one or more conductive layer 114 electrically connecting conductive layer 112 to conductive layer 113 while passing through dielectric structure 111. In some examples, conductive layer 112 and/or 113 can comprise or be referred to as traces, pads, circuit patterns, wiring patterns, or lands, and the one or more conductive layer 114 can comprise or be referred to as conductive vias or conductive paths. In the same or other examples, conductive layer 114 can be part of the same layer as either of conductive layer 112 or conductive layer 113. Although only two conductive layers 112 and 113 and one conductive layer 114 are shown in substrate 110, this is not a limitation of the present disclosure. In other examples, more than three conductive layers 112 and 113 and more than two conductive layers 114 can be formed over dielectric layer 111.

Dielectric structure 111 can be substantially planar. In some examples, dielectric structure 111 can comprise more than one or two dielectric layers. Dielectric structure 111 can comprise an electrically insulating material, including, for example, Si3N4, SiO2, SiON, polyimide (PI), benzocyclobutene (BCB), polybenzoxazole (PBO), bismaleimide triazine (BT), epoxy resin, phenolic resin, silicone resin, or acrylate polymer. In some examples, dielectric structure 111 can comprise one or more core layers (e.g., fiberglass) for improved rigidity, but there can be other examples where such core layer(s) can be omitted. In some examples, dielectric structure 111 can comprise or be referred to as, for example, an insulating structure, a passivation structure or a protection structure. Dielectric structure 111 can have a thickness in the range from approximately 10 microns to approximately 500 microns. Dielectric structure 111 can provide structural integrity for substrate 110, and/or can provide insulation where desired between portions of conductive layers 112 and 113 positioned on dielectric structure 111 and conductive layer 114 positioned in dielectric structure 111.

Conductive layers 112 and 113 can comprise or be referred to as conductive pads, micro pads, bond pads or lands. In some examples, conductive pad 112 can be formed to have a height from top surface 111a of dielectric structure 111. In some examples, conductive pad 113 can be formed to have a height from bottom surface 111b of dielectric structure 111.

In addition, conductive layers 112 and 113 can comprise an electrically conductive material, such as titanium, tungsten, titanium/tungsten, gold, silver, palladium, aluminum, copper or nickel. Conductive layers 112 and 113 can have a line thickness, line width and/or line space (pitch) in the range from approximately 30 microns to approximately 500 microns.

Conductive layer 114 can be referred to as conductive vias, conductive paths or conductive posts. In some examples, conductive layer 114 can comprise an electrically conductive material, such as titanium, tungsten, titanium/tungsten, gold, silver, palladium, aluminum, copper or nickel. Conductive layer 114 can have a line thickness, line width and/or line space (pitch) in the range from approximately 30 microns to approximately 500 microns.

Substrate 110 can be referred to as an interconnection structure, a printed circuit board (PCB), a printed wiring board, a single sided PCB, a double sided PCB, a multi-layered PCB, a through hole PCB, a non-through hole PCB, a rigid PCB, a flexible PCB, a paper phenol PCB, a glass epoxy PCB, a polyimide PCB, a polyester PCB, a molded plastic PCB, a ceramic PCB, an etched foil process PCB, an additive process PCB, a buildup PCB or a pre-molded leadframe. For example, when substrate 110 is a buildup structure, a carrier can be provided and dielectric layers and conductive layers can be formed, alternately stacking them on the carrier, without a core (e.g. fiberglass) layer. In some examples, substrate 110 can be a leadframe including only a conductive layer without a dielectric layer or molding material. Substrate 110 can have a thickness in the range from approximately 50 microns to approximately 500 microns.

Figure 2B:
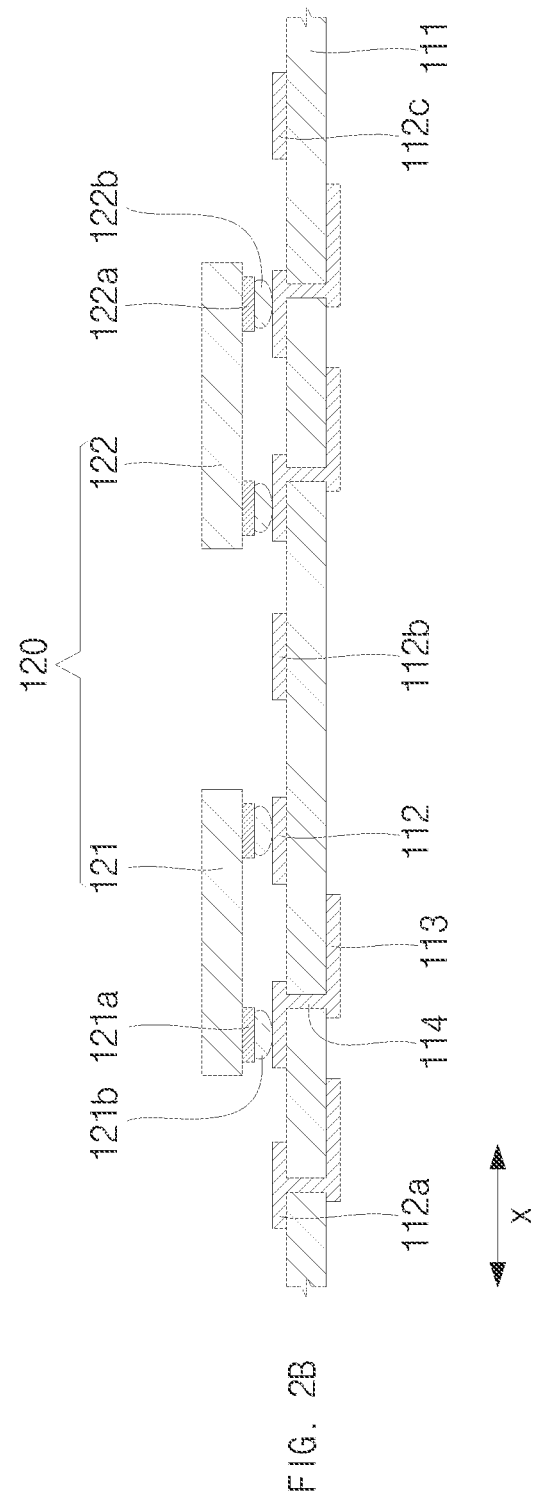

FIG. 2B illustrates semiconductor device 100 at a later stage of manufacture. In the example shown in FIG. 2B, electronic devices 121 and 122 can be electrically connected to conductive pad 112 of substrate 110.

In some examples, a pick-and-place equipment can pick up electronic devices 121 and 122 to place the same on conductive pad 112 of substrate 110. In the same or other examples, electronic devices 121 and 122 can be electrically connected to substrate 110 by mass reflow, thermal compression, or laser assisted bonding.

Electronic devices 121 and 122 can be mounted on substrate 110 spaced apart from each other. Substrate 110 can comprise at least one conductive pad 112b positioned between electronic devices 121 and 122. In addition, substrate 110 can further comprise at least one conductive pad 112a, 112c at either side of a length direction x in which electronic devices 121 and 122 are sequentially arranged.

In some examples, electronic devices 121 and 122 can be referred to as semiconductor dies or semiconductor chips, or either can be a package containing one or more semiconductor dies. In addition, in some examples, electronic device 121, 122 can comprise at least one of a logic die, a micro control unit, a memory, a digital signal processor, a network processor, a power management unit, an audio processor, an RF circuit, a wireless baseband system on chip processor, an application specific integrated circuit, a sensor, or an equivalent.

In some examples, electronic devices 121 and 122 can comprise an active region and a non-active region. In addition, in some examples, the active region can be disposed to face substrate 110. In addition, in some examples, the active region can comprise terminals 121a and 122a. In some examples, terminals 121a and 122a can be referred to as die pads, bond pads, aluminum pads, conductive pillars or conductive posts.

In addition, terminals 121a and 122a can be connected to conductive pad 112 of substrate 110 using terminal couplers 121b and 122b, which can comprise or be referred to as low melting point material 121b and 122b. There can be examples where terminal couplers 121b and 122b can be part of respective terminals 121a and 122a. In an example, terminal couplers 121b and 122b can comprise one selected from the group consisting of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu and equivalents. In some examples, terminal couplers 121b and 122b can be referred to as solder balls, solder bumps, solder caps, conductive balls, conductive bumps or conductive caps. Terminals 121a and 122a of electronic devices 121 and 122 and conductive pad 112 of substrate 110 can be electrically connected to each other by terminal couplers 121b and 122b. Terminals 121a and 122a and/or terminal couplers 121b and 122b can have a thickness in the range from approximately 5 microns to approximately 500 microns.

Although the illustrated electronic devices 121 and 122 are of, for example, flip-chip types, the active region can be provided on a surface opposite to the surface facing substrate 110. Here, terminal couplers 121b and 122b can be referred to as conductive wires. In addition, electronic devices 121 and 122 can be mounted on substrate 110 using an adhesive, and then interconnects 121a and 122a can be electrically connected to conductive pad 112 of substrate 110 by conductive wires 121b and 122b.

Figure 2C:
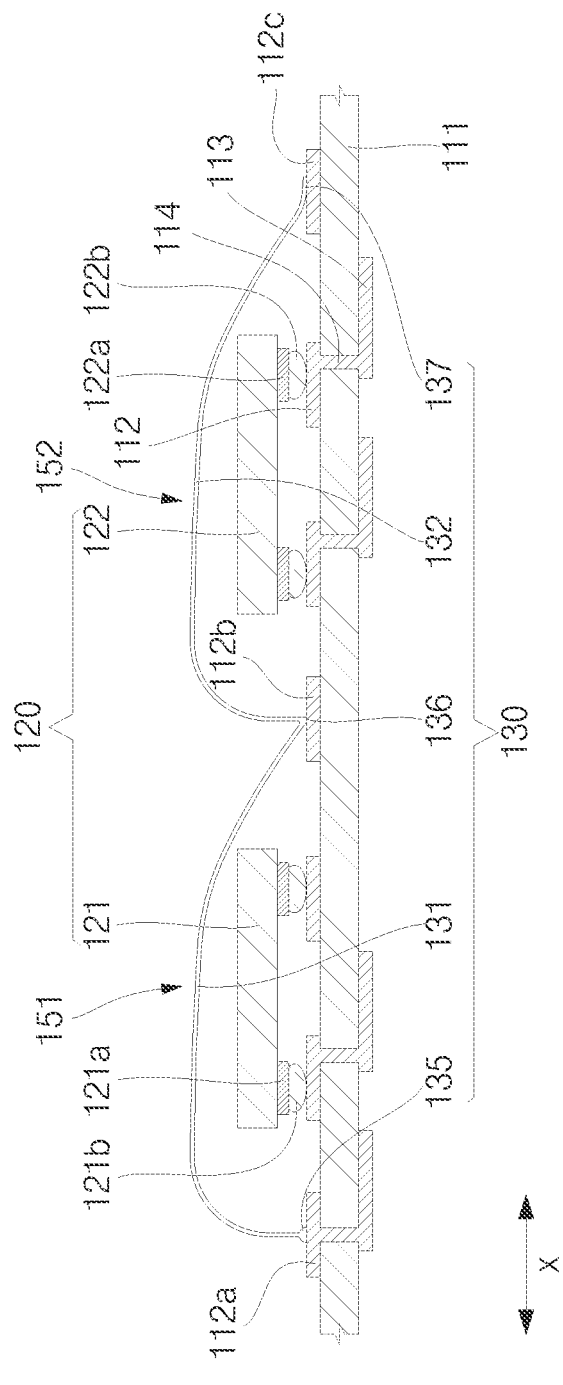

FIG. 2C illustrates semiconductor device 100 at a later stage of manufacture. In the example shown in FIG. 2C, wire structure 130 can be electrically connected to respective conductive pads 112a, 112b and 112c of substrate 110.

Wire structure 130 can be electrically connected to conductive pads 112a, 112b and 112c and can individually bound at least opposite ends of each of electronic devices 121 and 122. In some examples, wire structure 130 can cover electronic device 121 with a portion of wire structure 130 electrically connected to both conductive layers 112a and 112b, and can cover electronic device 122 with another portion of wire structure 130 electrically connected to both conductive pads 112b and 112c. Wire structure 130 can comprise, for example, an electrically conductive material, such as gold, silver, aluminum, palladium or copper. In addition, wire structure 130 can be electrically connected to ground of semiconductor device 100 or external ground through conductive pads 112a, 112b and 112c.

Wire structure 130 can comprise a wire. Wire structure or wire 130 can comprise wire portion 131 and wire portion 132.

Wire portion 131 can be spaced apart from side and top portions of electronic device 121. In some examples, more than two wire portions 131 can be formed to extend over electronic device 121, where such wire portions 131 can be parallel to each other in some implementations. The more than two wire portions 131 can be referred to as wire cage or Faraday cage 151. Electronic device 121 can be positioned inside wire cage 151. Wire cage 151 can shield electromagnetic interference to or from electronic device 121.

Wire portion 132 can be spaced apart from side and top portions of electronic device 122. In some examples, more than two wire portions 132 can be formed to extend over electronic device 122, where such wire portions 132 can be parallel to each other in some implementations. The more than two wire portions 132 can be referred to as a shield, a shielding structure, or a wire cage 152, such as a Faraday cage. Electronic device 122 can be positioned inside wire cage 152. Wire cage 152 can shield electromagnetic interference to or from electronic device 122.

Wire structure 130 can further comprise wire bonds 135, 136 and 137 spaced apart from electronic devices 121 and 122 and electrically connected to conductive pads 112a, 112b and 112c.

In some examples, wire bonds 135, 136 and 137, and wire portions 131 and 132 can be sequentially disposed in the lengthwise direction x. In some examples, wire bond 135 can be bonded to conductive pad 112a, wire portion 131 can be spaced apart from electronic device 121, wire bond 136 can be bonded to conductive pad 112b, wire portion 132 can be spaced apart from electronic device 122, and wire bond 137 can be bonded to conductive pad 112c.

Wire bonds 135, 136, and 137 can comprise different bond structure types. For example, wire bond 135 can be first ball bonded to conductive pad 112a, wire portion 131 can then be looped over and spaced apart from the side and top portions of electronic device 121, wire bond 136 can then be compression bonded to conductive pad 112b, wire portion 132 can then be looped over and spaced apart from the side and top portions of electronic device 122, and wire bond 137 can then be finally stitch bonded to conductive pad 112c, by means of a bonding tool (e.g., capillary).

In some examples, conductive pads 112a, 112b and 112c can be referred to as bonding pads that are pads to be bonded to wire structure 130. Wire structure 130 can be a single or continuous wire integrally formed to be sequentially bonded to bonding pads 112a, 112b and 112c in that order. In some examples, wire structure 130 can be referred to as a conductive wire or a bonding wire. Wire structure 130 can have a thickness in the range from approximately 15 microns to approximately 50 microns.

Electronic device 121 can be positioned inside wire cage 151 including wire portion 131 and wire bonds 135 and 136. In some examples, wire cage 151 can comprise more than two wire portions 131, which can be parallel with each other. Wire cage 151 can shield electromagnetic interference to or from electronic device 121. Electronic device 122 can be positioned inside wire cage 152 including wire portion 132 and wire bonds 136 and 137. In some examples, wire cage 152 can comprise more than two wire portions 132, which can be parallel with each other. Wire cage 152 can shield electromagnetic interference to or from electronic device 122. Such wire structure 130 will be described in more detail with reference to FIGS. 3A to 3D later.

Figure 2D:
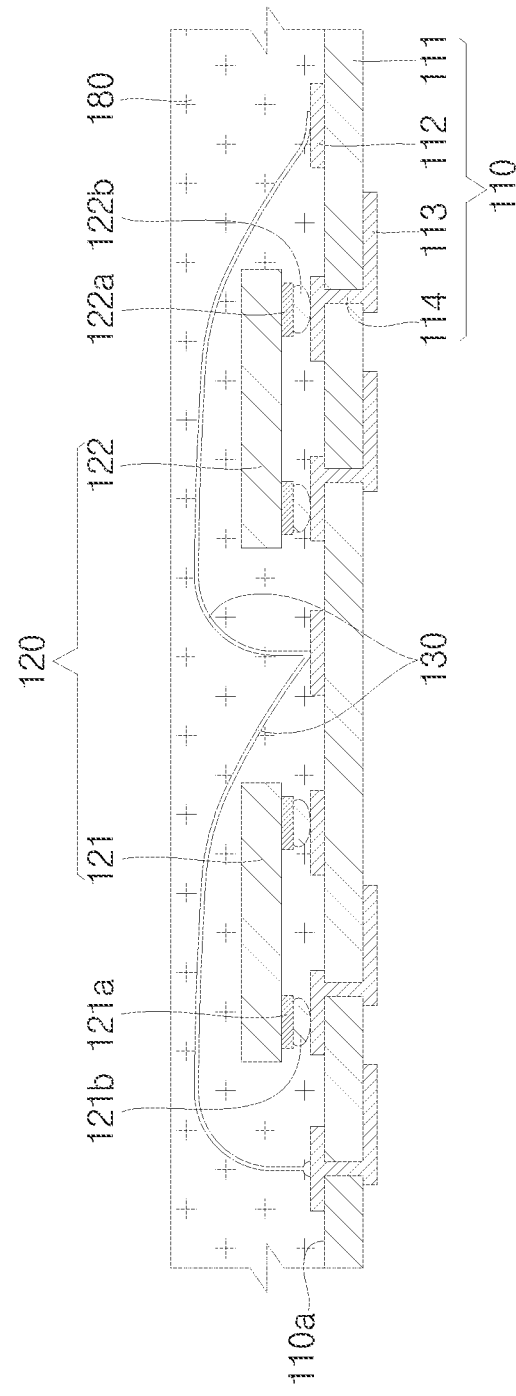

FIG. 2D illustrates semiconductor device 100 at a later stage of manufacture. In the example shown in FIG. 2D, encapsulant 180 can be formed to entirely cover a top surface 110a of substrate 110, electronic device 120 and wire structure 130. In some examples, encapsulant 180 can be referred to as an epoxy molding compound, an epoxy molding resin or a sealant. In addition, in some examples, encapsulant 180 can be referred to as a molding part, a sealing part, an encapsulation part, a protection part, a package or a body part. In some examples, encapsulant 180 can comprise, but not limited to, an organic resin, an inorganic filler, a curing agent, a catalyst, a colorant and a flame retardant. Molding based on encapsulant 180 can be formed by any of a variety of processes. In some examples, encapsulant 180 can be formed by, but not limited to, compression molding, transfer molding, liquid-phase encapsulant molding, vacuum lamination, paste printing or film assist molding. Encapsulant 180 can have a thickness in the range from approximately 100 microns to approximately 1000 microns. Encapsulant 180 can encapsulate electronic device 120 and wire structure 130, thereby protecting electronic device 120 and wire structure 130 from external elements or environmental exposure.

Figure 2E:
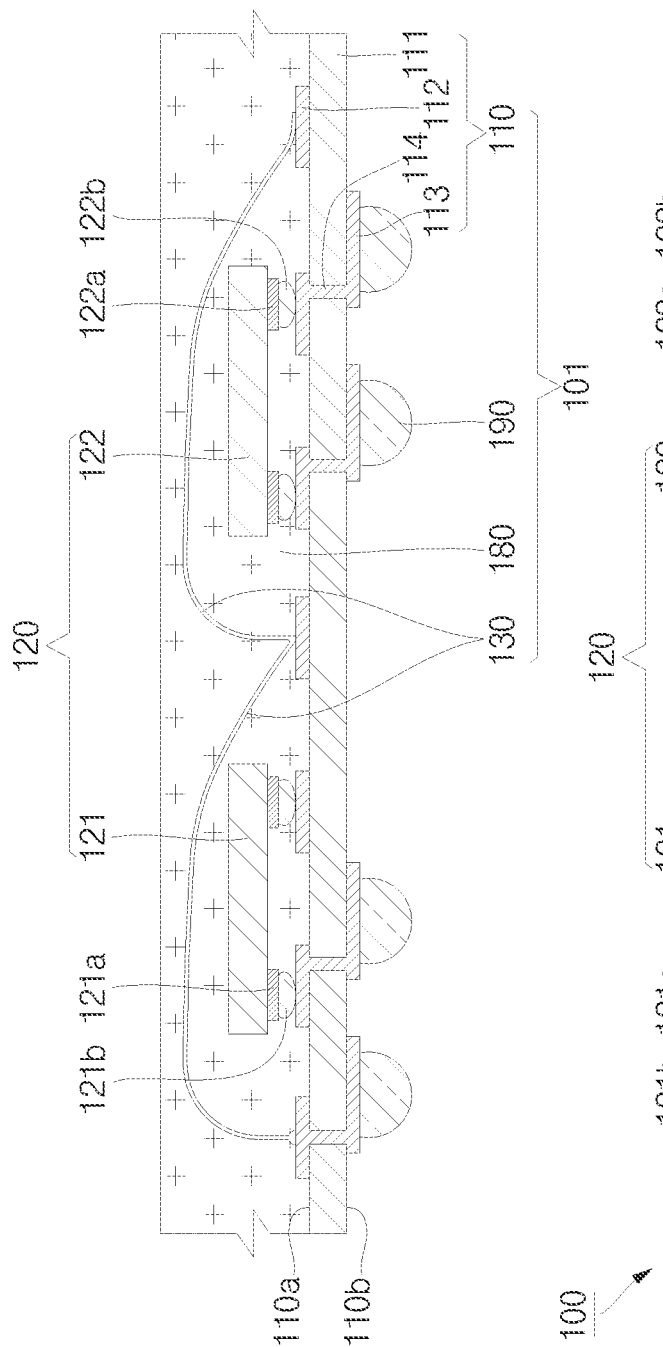

FIG. 2E illustrates semiconductor device 100 at a later stage of manufacture. In the example shown in FIG. 2E, interconnects 190 can be formed on conductive pads 113 exposed to a bottom surface 110b of substrate 110.

The interconnect 190 can be electrically connected to a bottom surface of the conductive pad 113. Interconnects 190 can be electrically connected to electronic device 120 through conductive layers 112, 113 and 114 of substrate 110. In addition, interconnects 190 can be electrically connected to wire structure 130 through conductive layers 112, 113 and 114, and the interconnects 190 electrically connected to wire structure 130 can be electrically connected to ground.

In some examples, interconnects 190 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. Interconnects 190 can be formed by, for example, a ball drop process, a screen-printing process, or an electroplating process. In some examples, interconnects 190 can be formed by forming an electrically conductive material including solder on the bottom surface of conductive pad 113 of substrate 110 using a ball drop process, followed by a reflow process. At this stage, the bottom surface 110b of substrate 110 can be disposed to face upward. Interconnects 190 can be referred to as conductive balls such as solder balls, conductive pillars such as copper pillars, or conductive posts having solder caps on copper pillars. Interconnects 190 can have a thickness in the range from approximately 80 microns to approximately 500 microns.

Figure 2F:
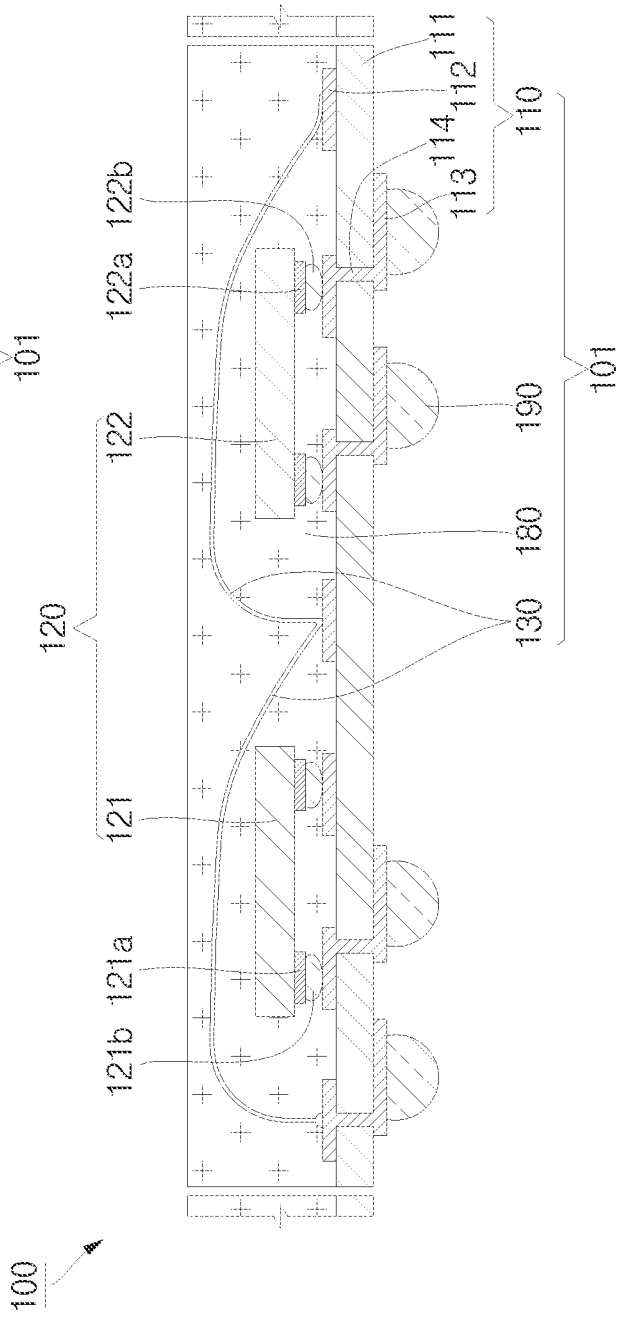

FIG. 2F illustrates semiconductor device 100 at a later stage of manufacture. In the example shown in FIG. 2F, a plurality of semiconductor devices can be separated into individual semiconductor devices 100.

Encapsulant 180 and substrate 110 can be diced into a discrete semiconductor device 100 including at least two electronic devices 121 and 122. For example, encapsulant 180 and substrate 110 can be diced using a dicing tool, such as a diamond wheel or a laser beam, thereby completing the discrete semiconductor device 100. The completed semiconductor device 100 can comprise substrate 110, at least two electronic devices 121 and 122, wire structure 130 shielding electromagnetic inference by bounding the at least two electronic devices 121 and 122 using wire cages 151 and 152, encapsulant 180 protecting electronic device 120 and wire structure 130 from external environmental exposure, and interconnects 190 as input/output terminals.

Figure 3A:
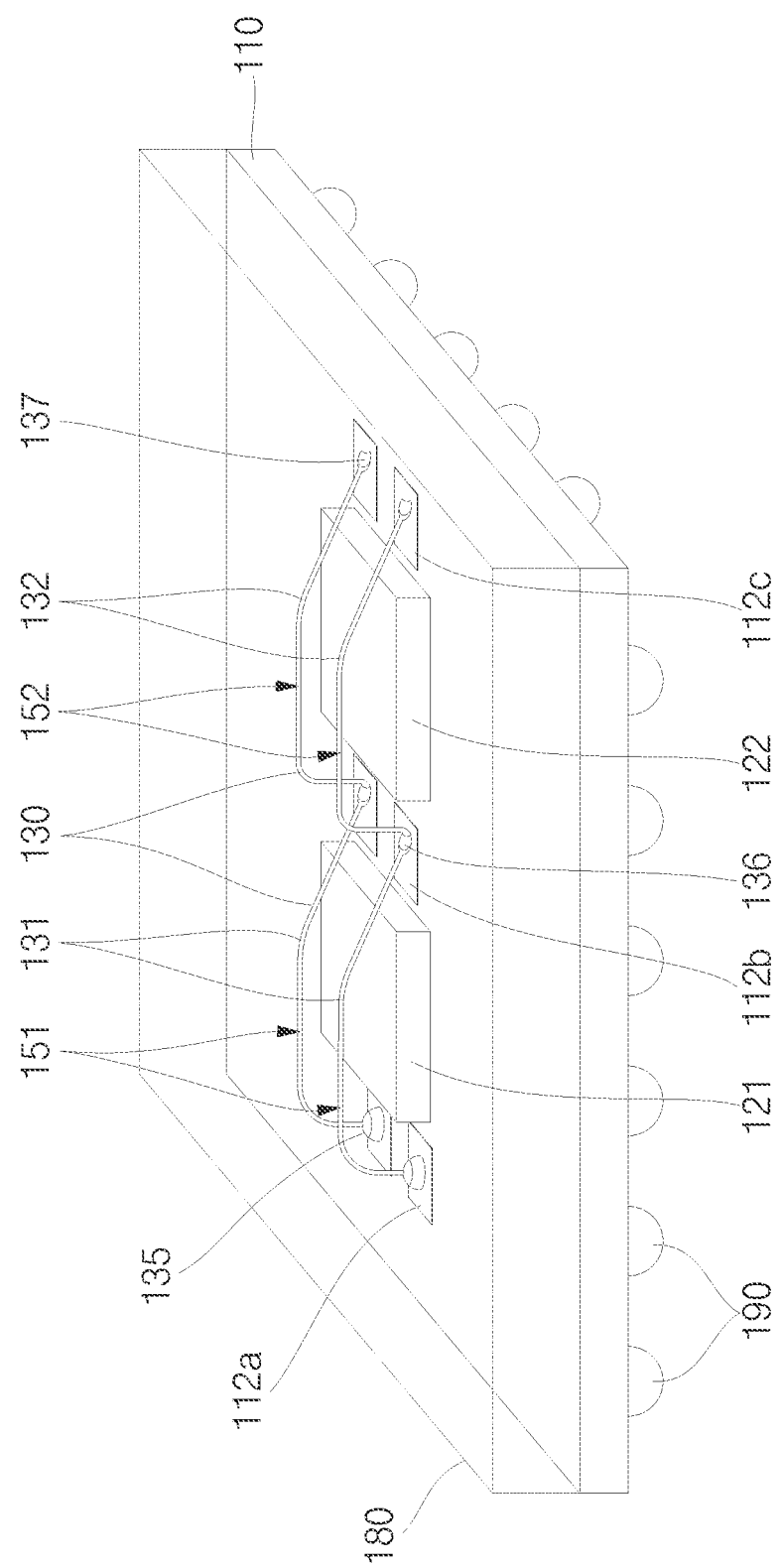
FIG. 3A shows a perspective view showing a case where a wire structure shown in FIG. 2C comprises wire cages.

FIG. 3A illustrates a perspective view showing a case where a wire structure shown in FIG. 2C comprises wire cages. In the example shown in FIG. 3A, wire structure 130 can comprise wire cages 151 and 152. Wire cage 151 can comprise, for example, plural wire portions 131 covering electronic device 121, thereby shielding electromagnetic interference to or from electronic device 121. Wire cage 152 can comprise, for example, plural wire portions 132 parallel with each other and covering electronic device 122, thereby shielding electromagnetic interference to or from electronic device 122. Although two wire portions per wire cage are shown, this is not a limitation of the present disclosure. In other examples, three or more wire portions per wire cage can be provided.

In some examples, the pitch of each of the wire portions 131 and 132 can be determined according to the wavelength of the electromagnetic wave to be cut off. For example, the pitch of each of the wire portions 131 and 132 can be less than the wavelength of the electromagnetic wave to be cut off.

In some examples, wire bonding of wire structure 130 can be performed by bonding tool with a capillary, a wire clamp and a wire spool. Wire bond 135 can be firstly bonded to conductive pad 112a by the capillary, which can have approximately ball bonding shape. In some examples, wire portion 131 can cover electronic device 121 and/or be spaced apart from electronic device 121 by the capillary, which can form a loop height measured from the surface of substrate 110.

In some examples, wire bond 136 can be compression bonded to conductive pad 112b by the capillary, which can have an asymmetrical slippage. In some examples, when the capillary rises from conductive pad 112b, the wire clamp is not closed. For example, a tailing operation is not performed when the capillary is lifted from conductive pad 112b. Therefore, a pair of compression bonding portions can be connected to each other without cutting.

In some examples, wire portion 132 can cover electronic device 121 and/or be spaced apart from electronic device 122 by the capillary, which can form a loop height measured from the surface of substrate 110. In some examples, wire bond 137 can be finally stitch bonded to conductive pad 112c by the capillary, which can have a slippage. In some examples, when the capillary rises from conductive pad 112c, the wire clamp is closed. For example, the tailing operation is performed when the capillary is lifted from conductive pad 112c. Therefore, a stitch bonding portion and a tail bonding portion can be disconnected. In some examples, the stitch bonding portion of wire bond 137 can remain on conductive pad 112c while the tail bonding portion of wire bond 137 can be removed on conductive pad 112c.

In this manner, wire structure or single wire 130 can provide continuous wire portions 131 and 132, while the shape of wire bonds 135, 136 and/or 137 can be different from each other. In some examples, wire bond 135 can have approximately a ball bonding shape, wire bond 136 can have approximately a compression bonding shape, and wire bond 137 can have approximately a stitch bonding shape.

In this way, instead of forming a ball bonding portion and a stitch bonding portion between the electronic devices 121 and 122, the compression bonding portions mutually connected are formed, thereby permitting a narrowing of the space required between electronic devices 121 and 122.

The space can be an important factor, for example, for SiP (System in Package) technology because more electronic devices and/or components can be loaded on limited area in substrate 110. For example, if a stitch bond and a ball bond were to be formed in conductive pad 112b between the electronic devices 121 and 122 for making wire cage, space would be needed for the stitch bond formation, for the ball bond formation, and also for capillary motion (including forward motion for the loop start after ball bond formation, and backward motion for the stitch bonding).

In contrast, the continuous compression bonding proposed by the present disclosure can reduce the space between electronic devices 121 and 122 because there is no need to form both a stitch bond and a ball bond between electronic devices 121 and 122.

Figure 3B:
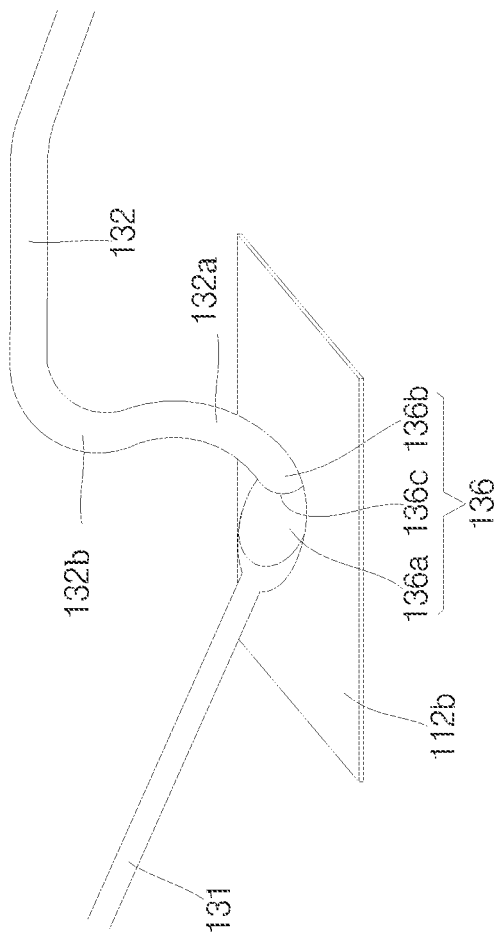
FIGS. 3B and 3C show a perspective and a plane view of an example wire structure on a conductive layer, respectively.
Figure 3C:
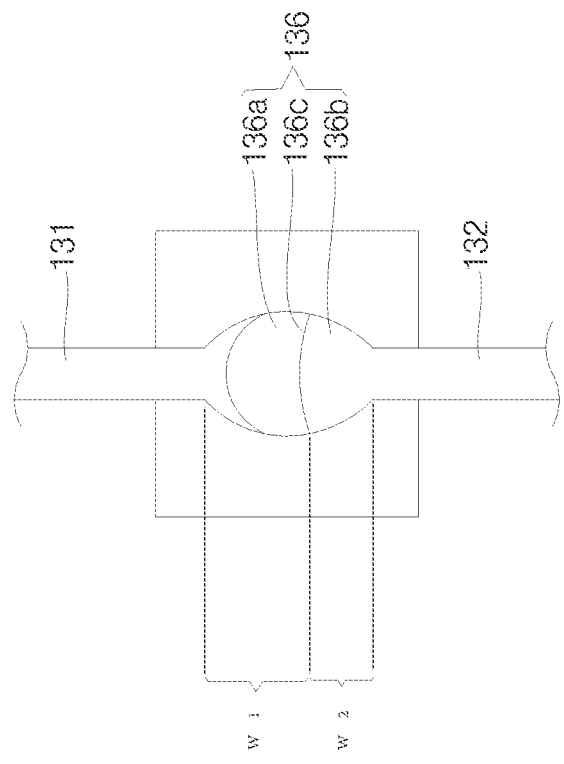
Figure 3D:
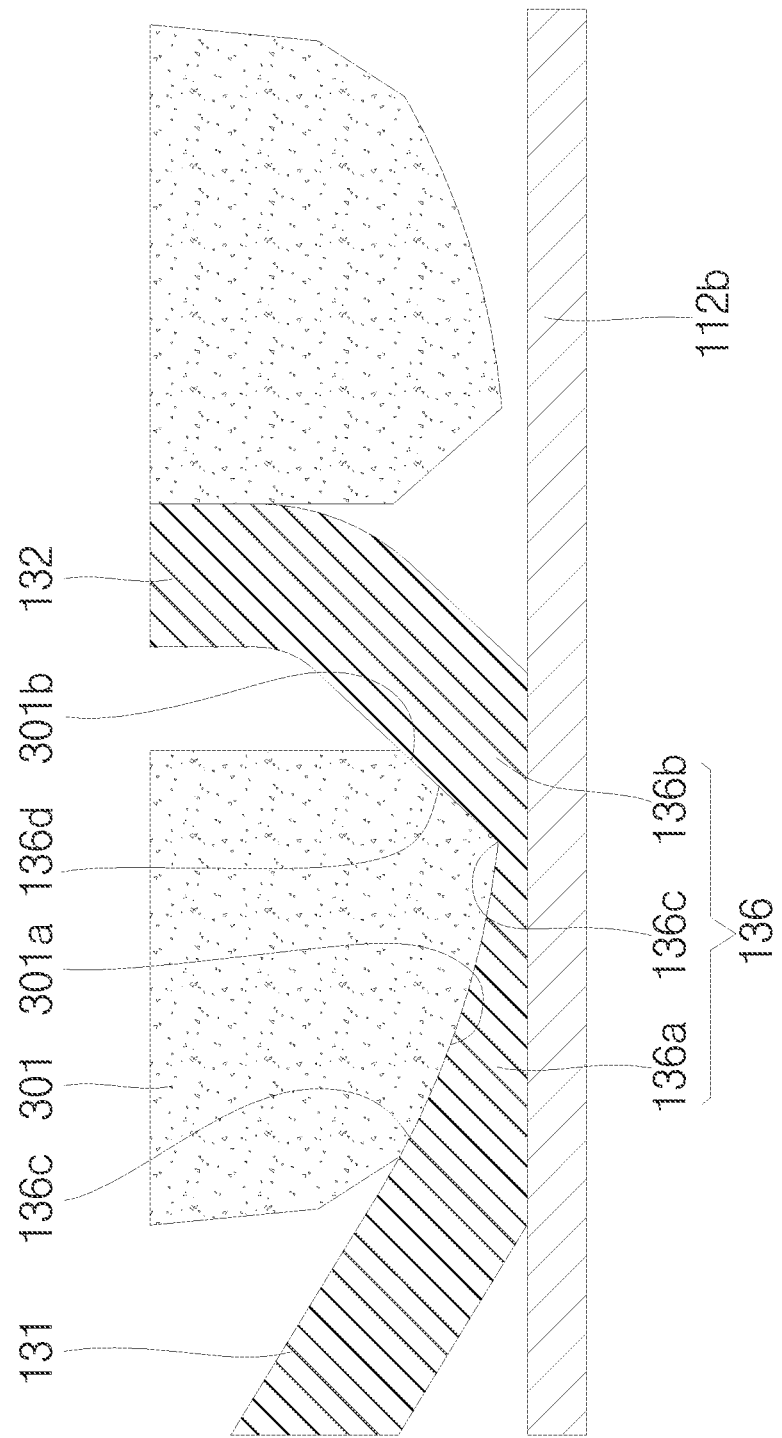
FIG. 3D shows a cross-sectional view showing a case where a compression bonding is performed by a capillary.

FIGS. 3B and 3C show a perspective and a plane view of an example wire structure on a conductive layer, respectively. FIG. 3D illustrates a cross-sectional view showing a case where a compression bonding is performed by a capillary.

In the example shown in FIGS. 3B to 3D, wire bond 136 can comprise compression bonding portions 136a and 136b. In some examples, compression bonding portion 136a can be mainly formed by lower end outer surface 301a of capillary tip 301, and compression bonding portion 136b can be formed mainly by lower end inner surface 301b of capillary tip 301. In some examples, compression bonding portions 136a and 136b can be electrically and mechanically coupled to each other, compression bonding portion 136a can have low slope surface 136c, and compression bonding portion 136b can have steep slope surface 136d. Further, a width and/or area of compression bonding portion 136a can be wider than the width and/or area of compression bonding portion 136b. This can be due to the difference in shape between lower end outer surface 301a and lower end inner surface 301b of capillary tip 301.

In some examples, a thickness of boundary portion 136c between compression bonding portions 136a and 136b can be relatively less than a thickness of other peripheral portions (e.g., compression bonding portions 136a and 136b). This can be because a lower portion between lower end outer surface 301a and lower end inner surface 301b of capillary tip 301 can be protruded at an obtuse angle. Although the boundary portion 136c is shown in FIG. 3D as having the obtuse angle, this is not a limitation of the present disclosure. In other examples, the boundary portion 136c can be formed in a rounded shape. Therefore, in some examples, the boundary portion 136c need not be clearly distinguished between the compression bonding portions 136a and 136b. In general, boundary portion 136c can depend on the shape of the lower portion between lower end outer surface 301a and lower end inner surface 301b of the capillary tip 301. In some examples, wire portion 132 includes a first portion 132a connected to compression bonding portion 136b that extends upward and laterally away from compression bond 136 in a first direction, and includes a second portion 132b that bends laterally back towards compression bond 136 in a second direction before wire portion 132 bends again to extend over electronic device 122. In some examples, first portion 132a and second portion 132b form an S-like shape in a side view. This configuration provides, for example, wire portion 132 with a shape that facilitates closer spacing between electronic device 121 and electronic device 122.

Figure 4:
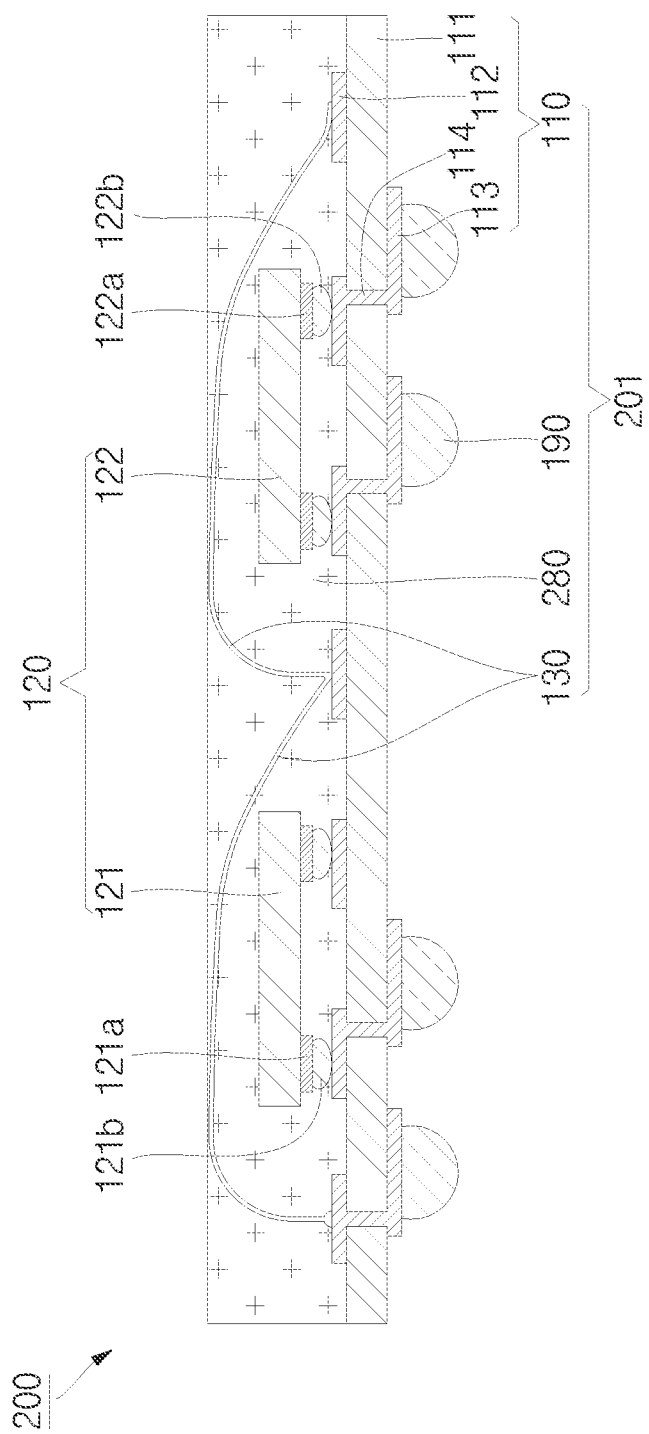
FIG. 4 shows a cross-sectional view of another example semiconductor device.

FIG. 4 illustrates a cross-sectional view of another example semiconductor device 200. The semiconductor device 200 shown in FIG. 4 is slightly different from the semiconductor device 100 shown in FIG. 1 due to a processing difference. In the example shown in FIG. 4, semiconductor device 200 can comprise substrate 110, electronic device 120, wire structure 130, encapsulant 280 and interconnects 190.

Encapsulant 280 can cover a top surface of substrate 110, electronic device 120 and a portion of wire structure 130. Here, a portion of wire structure 130 can be exposed to a top portion of encapsulant 280. In some examples, each partial area of the wire portions 131 and 132 can be exposed to the exterior through the top portion of encapsulant 280. In some examples, each of the other areas of wire portions 131 and 132 can still be positioned inside encapsulant 280. In this way, semiconductor device 200 according to the present disclosure can have a relatively small thickness.

FIGS. 5A and 5B show cross-sectional views of an example method for manufacturing another example semiconductor device 200.

FIG. 5A illustrates semiconductor device 200 at a later stage of manufacture, following stages similar to those described above for FIGS. 2A-2C. In the example shown in FIG. 5A, encapsulant 280 can be formed to entirely cover a top surface 110a of substrate 110, electronic device 120 and wire structure 130. In some examples, a top portion of encapsulant 280 can be removed by grinding or etching, thereby exposing a top portion 130x of wire structure 130 to the outside. For example, the top portion 130x of wire structure 130 can be positioned at topmost ends of wire portions 131 and 132 or wire cages 151 and 152. The top portion 130x of wire structure 130 can be exposed to the outside through a top surface 280a of encapsulant 280. The top surface 280a of encapsulant 280 can be removed by grinding or etching to expose the top portion 130x of wire structure 130 to the outside, thereby reducing the overall thickness of semiconductor device 200. In addition, wire structure 130 can be exposed to the outside of encapsulant 280, thereby improving heat radiation efficiency of semiconductor device 200. Encapsulant 280 can have a thickness in the range from approximately 100 microns to approximately 1000 microns.

FIG. 5B illustrates semiconductor device 200 at a later stage of manufacture. In the example shown in FIG. 5B, a plurality of semiconductor devices can be separated into individual semiconductor devices 200. Encapsulant 280 and substrate 110 can be diced into a discrete semiconductor device 200 including at least two electronic devices 121 and 122. For example, encapsulant 280 and substrate 110 can be diced using a dicing tool, such as a diamond wheel or a laser beam, thereby completing the discrete semiconductor device 200.

In summary, a packaged electronic device structure and associated methods have been described that comprise a wire structure bonded to a substrate and disposed to overlie at least two electronic devices. In some examples, the wire structure comprises a continuous single wire structure bonded to a first conductive pad with first bond structure, extending to overlie a first electronic device, bonded to a second conductive pad with a second bond structure, extending to overlie a second electronic device, and bonded to a third conductive pad with a third bond structure. The second bond structure is different than the first bond structure, and, in some examples, comprises a compression bond structure. The second bond structure is configured so that the spacing between the first electronic device and the second electronic device can be reduced thereby by saving substrate space. Among other things, this supports smaller and more cost effective packaged electronic devices.

While the subject matter of the disclosure is described with specific example steps and example embodiments, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. An electronic device structure, comprising:
   a substrate comprising:
      a top surface;
      a bottom surface opposite to the top surface; and
      a conductive structure formed adjacent to the top surface and comprising:
         a first conductive pad;
         a second conductive pad; and
         a third conductive pad;
   a first electronic device disposed adjacent to the top surface at a first location;
   a second electronic device disposed adjacent to the top surface at a second location laterally spaced apart from the first electronic device, wherein:
      the first electronic device is interposed between the first conductive pad and the second conductive pad; and
      the second electronic device is interposed between the second conductive pad and the third conductive pad; and
   a first wire structure comprising:
      a first bond structure connected to the first conductive pad;
      a second bond structure connected to the second conductive pad;
      a third bond structure connected to the third conductive pad;
      a first wire portion interconnected between the first bond structure and the second bond structure and disposed to overlie the first electronic device; and
      a second wire portion interconnected between the second bond structure and the third bond structure and disposed to overlie the second electronic device;
   wherein:
      the first wire structure is a continuous single wire structure; and
      the second wire portion of the first wire structure comprises:
         a first portion connected to the second bond structure that extends upward and away from the second bond structure in a first direction; and
         a second portion connected to the first portion that bends laterally back towards the second bond structure in a second direction.

2. An electronic device structure, comprising:
   a substrate having a conductive structure;
   electronic devices coupled to the substrate; and
   a first wire structure coupled to the conductive structure in at least three locations, wherein:

the first wire structure overlies at least two electronic devices;
the first wire structure is a continuous single wire structure;
one of the at least two electronic devices has a major surface with a width;
the substrate comprises:
a top surface; and
a bottom surface opposite to the top surface;
the conductive structure is adjacent to the top surface;
the at least two electronic devices comprise:
a first electronic device disposed adjacent to the top surface at a first location; and
a second electronic device disposed adjacent to the top surface at a second location laterally spaced apart from the first electronic device;
the first wire structure comprises:
a first bond structure connected to a first portion of the conductive structure;
a second bond structure connected to a second portion of the conductive structure;
a third bond structure connected to third portion of the conductive structure;
a first wire portion interconnected between the first bond structure and the second bond structure and disposed to overlie the first electronic device; and
a second wire portion interconnected between the second bond structure and the third bond structure and disposed to overlie the second electronic device;
the first wire portion comprises a diameter that is less than the width; and
the first wire portion has a maximum height above the substrate at a location other than a center of the first electronic device.

3. The electronic device structure of claim 2, wherein:
the first wire structure comprises a plurality of single continuous wire structures each bonded to the conductive structure in at least three locations.

4. The electronic device structure of claim 2, wherein:
the first portion of the conductive structure comprises a first conductive pad;
the second portion of the conductive structure comprises a second conductive pad;
the third portion of the conductive structure comprises a third conductive pad;
the first electronic device is interposed between the first conductive pad and the second conductive pad;
the second electronic device is interposed between the second conductive pad and the third conductive pad; and
the second bond structure is of a different type than the first bond structure.

5. The electronic device structure of claim 4, wherein:
the conductive structure further comprises:
a fourth conductive pad proximate to the first conductive pad;
a fifth conductive pad proximate to the second conductive pad; and
a sixth conductive pad proximate to the third conductive pad;
the electronic device structure further includes a second wire structure comprising:
a fourth bond structure connected to the fourth conductive pad;
a fifth bond structure connected to the fifth conductive pad;
a sixth bond structure connected to the sixth conductive pad;
a third wire portion interconnected between the fourth bond structure and the fifth bond structure and disposed to overlie the first electronic device; and
a fourth wire portion interconnected between the fifth bond structure and the sixth bond structure and disposed to overlie the second electronic device;
the fifth bond structure comprises a different bond structure than that of the fourth bond structure;
the second wire structure comprises a second continuous single wire structure; and
the electronic device structure further includes a shielding structure for the first electronic device and the second electronic device comprises the first wire structure and the second wire structure.

6. The electronic device structure of claim 4, wherein:
the second bond structure comprises a compression bond structure comprising:
a first compression bonding portion having a first slope;
a second compression bonding portion having a second slope; and
a third compression bonding portion electrically and mechanically coupling the first compression bonding portion to the second compression bonding portion;
the third compression bonding portion forms an obtuse angle with the second compression bonding portion in a cross-sectional view; and
the third compression bonding portion has a thickness that is less than that of the first compression portion and the second compression bonding portion.

7. An electronic device structure, comprising:
a substrate comprising:
a top surface;
a bottom surface opposite to the top surface; and
a conductive structure formed adjacent to the top surface and comprising:
a first conductive pad;
a second conductive pad; and
a third conductive pad;
a first electronic device disposed adjacent to the top surface at a first location;
a second electronic device disposed adjacent to the top surface at a second location laterally spaced apart from the first electronic device, wherein:
the first electronic device is interposed between the first conductive pad and the second conductive pad; and
the second electronic device is interposed between the second conductive pad and the third conductive pad; and
a first wire structure comprising:
a first bond structure connected to the first conductive pad;
a second bond structure connected to the second conductive pad;
a third bond structure connected to the third conductive pad;
a first wire portion interconnected between the first bond structure and the second bond structure and disposed to overlie the first electronic device; and
a second wire portion interconnected between the second bond structure and the third bond structure and disposed to overlie the second electronic device, wherein:
the first wire structure is a continuous single wire structure;

the second bond structure comprises a different bond type than the first bond structure; and the first wire portion has a maximum height above the substrate at a location other than a center of the first electronic device.

8. The electronic device structure of claim 7, wherein:
the second wire portion has a maximum height above the substrate at a location proximate to the second conductive pad.

9. The electronic device structure of claim 7, wherein:
the conductive structure further comprises:
   a fourth conductive pad proximate to the first conductive pad;
   a fifth conductive pad proximate to the second conductive pad; and
   a sixth conductive pad proximate to the third conductive pad;
the electronic device structure further includes a second wire structure comprising:
   a fourth bond structure connected to the fourth conductive pad;
   a fifth bond structure connected to the fifth conductive pad;
   a sixth bond structure connected to the sixth conductive pad;
   a third wire portion interconnected between the fourth bond structure and the fifth bond structure and disposed to overlie the first electronic device; and
   a fourth wire portion interconnected between the fifth bond structure and the sixth bond structure and disposed to overlie the second electronic device,
the fifth bond structure comprises a different bond type than that of the fourth bond structure;
the second wire structure comprises a second continuous single wire structure; and
the electronic device structure further includes a shielding structure for the first electronic device and the second electronic device comprising the first wire structure and the second wire structure.

10. The electronic device structure of claim 7, wherein the second wire portion of the first wire structure comprises:
a first portion connected to the second bond structure that extends upward and away from the second bond structure in a first direction; and
a second portion connected to the first portion that bends laterally back towards the second bond structure in a second direction.

11. The electronic device structure of claim 7, wherein:
the first bond structure comprises a ball bonded structure;
the second bond structure comprises a compression bonded structure;
the first wire portion has a first shape proximate to the second bond structure;
the second wire portion as a second shape proximate to the second bond structure; and
the second shape is different than the first shape.

12. The electronic device structure of claim 7, wherein:
the second bond structure comprises a compression bond structure comprising:
   a first compression bonding portion having a first width and a first slope;
   a second compression bonding portion having a second width and a second slope; and
   a third compression bonding portion electrically and mechanically coupling the first compression bonding portion to the second bonding compression portion.

13. The electronic device structure of claim 12, wherein:
the third compression bonding portion has a thickness that is less than that of the first compression bonding portion and the second compression bonding portion; and
the first width is greater than the second width.

14. The electronic device structure of claim 7, further comprising:
an encapsulant disposed to cover the top surface of the substrate, the first electronic device, the second electronic device, and at least a portion of the first wire structure.

15. The electronic device structure of claim 14, wherein:
a portion of the first wire structure is exposed outside a top portion of the encapsulant.

\* \* \* \* \*